US005432375A

United States Patent [19]

Agnvall et al.

[11] Patent Number: 5,432,375

[45] Date of Patent: Jul. 11, 1995

[54] THERMISTOR INTENDED PRIMARILY FOR TEMPERATURE MEASUREMENT

[75] Inventors: Clas-Göran Agnvall, Lund; Ingvar Hansson, Södra Sandby; Per Hällje, Veberöd; Roy Saaro; Per Silverberg, both of Lund, all of Sweden

[73] Assignee: Astra Tech Aktiebolag, Molndal, Sweden

[21] Appl. No.: 725,404

[22] Filed: Jul. 1, 1991

Related U.S. Application Data

[63] Continuation of Ser. No. 362,025, Jun. 6, 1989, abandoned.

[30] Foreign Application Priority Data

Jun. 8, 1988 [SE] Sweden ................................ 8802134

[51] Int. Cl.[6] ....................... H01L 23/56; H01L 29/66

[52] U.S. Cl. .................................... 257/467; 257/536; 257/528; 257/541

[58] Field of Search ........................ 357/28, 55, 69, 65, 357/80, 29; 257/467, 528, 536, 537, 541

[56] References Cited

U.S. PATENT DOCUMENTS

| | | | |
|---|---|---|---|
| 2,693,023 | 11/1954 | Kerridge | 29/155.5 |
| 3,379,063 | 4/1968 | Schonberger | 73/362 |
| 3,402,448 | 9/1968 | Heath | 29/25.42 |
| 3,422,386 | 1/1969 | Helgeland | 338/309 |
| 3,507,154 | 4/1970 | Schonberger | 73/363.29 |
| 3,548,492 | 12/1970 | Weber | 29/602 |
| 3,657,692 | 4/1972 | Wormser | 338/252 |
| 3,787,965 | 1/1974 | Cocca et al. | 29/620 |
| 3,827,142 | 8/1974 | Bennett | 29/620 |
| 3,936,789 | 2/1976 | Matzen | 338/22 |
| 4,200,970 | 5/1980 | Schonberger | 29/593 |
| 4,236,298 | 12/1980 | Schonberger | 29/610 R |
| 4,332,081 | 6/1982 | Francis | 29/612 |
| 4,531,842 | 7/1985 | Schonberger | 371/1 |

FOREIGN PATENT DOCUMENTS

| | | |
|---|---|---|
| 0019017 | 11/1980 | European Pat. Off. . |
| 0150784 | 8/1985 | European Pat. Off. . |
| 0213239 | 11/1987 | European Pat. Off. . |
| 2645783 | 4/1978 | Germany . |
| 3127727 | 2/1983 | Germany . |
| 129100 | 8/1950 | Sweden . |
| 72096480 | 3/1976 | Sweden . |
| 552660 | 6/1939 | United Kingdom . |
| 1226789 | 3/1971 | United Kingdom . |
| 1287930 | 9/1972 | United Kingdom . |
| 1470630 | 4/1977 | United Kingdom . |
| 1474731 | 5/1977 | United Kingdom . |

*Primary Examiner*—William Mintel
*Assistant Examiner*—Roy Potter
*Attorney, Agent, or Firm*—White & Case

[57] ABSTRACT

The invention relates to a thermistor, primarily intended for temperature measurement. The thermistor comprises at least two thermistor plates (14–17) on a carrier (10), adjacent to each other and connected in series. The plates are separated from each other by a preferably elongated gap (18) and the upper surfaces of said plates are largely covered by upper electrode surfaces (24–26). The thermistor plates (14–17) are arranged within a limited area of the carrier (10) so that the maximum aggregate area of the thermistor plates (14–17) is constant, whereas the size of each individual thermistor surface is variable by displacement of the position of the gap(s) (18) within the said limited area of the carrier (10), for adjustment of the total resistance of the thermistor to different values. The invention also relates to a procedure for manufacturing a thermistor.

17 Claims, 8 Drawing Sheets

THERMISTOR INTENDED PRIMARILY FOR TEMPERATURE MEASUREMENT

This application is a continuation of application Ser. No. 07/362,025, filed on Jun. 6, 1989, now abandoned.

TECHNICAL FIELD OF THE INVENTION

The present invention relates to a thermistor, primarily intended for temperature measurement. The thermistor is simple in its design and construction, and is inexpensive to produce. The design of the thermistor allows effective trimming, to give readings of great precision. These characteristics make the thermistor according to the invention particularly suitable for use in disposable products, such as disposable medical thermometers.

The invention also relates to a procedure for the manufacture of a thermistor.

BACKGROUND OF THE INVENTION

A thermistor is a semiconductor, the resistive properties of which vary with the temperature. In order to enable the resistive properties of the thermistor to be utilized, it is provided with contacts that can be connected to an electric circuit. The resistance and temperature sensitivity of the thermistor are determined by the composition of the material of the semiconductor, the physical dimensions of the active substance of the thermistor, and the temperature.

The fact that the resistance depends on the physical dimensions of the material of the thermistor makes it possible to regulate the ohmic value of the thermistor by removing or trimming off some of the material. The resistance of the thermistor is also determined by the area of the contact surfaces on the thermistor material, which means that the ohmic value of the thermistor can be adjusted by removing or trimming off some of the contact surface on the material of the thermistor.

Different types of thermistor are known. In GB-A-1470630 a thermistor produced by a thick-film process is described. A first layer of contact material is applied to a substrate plate by screen printing, forming a number of pairs of electrodes. After firing, a second layer of thermistor material is printed on the first, to form a thermistor plate over the pair of electrodes. After refiring, the thermistor is trimmed by having part of the material removed with the aid of a laser. The substrate plate is divided into discrete thermistor elements and encapsulated in a protective layer of suitable material.

GB-A-1287930 describes a thermistor consisting of a first layer of contact material, a second layer of thermistor material fully encapsulating the first layer, and two electrode surfaces arranged parallel on the thermistor layer.

GB-A-1226789 shows a similar thermistor arranged on a substrate plate, which consists of a thermistor plate between a lower and an upper electrode surface. The electrode surfaces are extended in opposite directions on the substrate plate, in order to form contact surfaces for connection to an electric circuit.

None of the thermistors previously known is designed to be simply and very flexibly adaptable to different spheres of use while maintaining the possibility of high precision with the aid of exact trimming. This is essential to the production and trimming of the thermistors at a low enough cost for them to be usable as disposable products, such as disposable thermometers.

SUMMARY OF THE INVENTION

The object of the present invention is thus to produce a thermistor specifically designed for temperature measurement and suitable for disposable use, while possessing high accuracy and flexibility of application.

The thermistor must therefore be possible to produce very efficiently with a high degree of automation and high rate of production, despite the strict requirement for accuracy. The absolute resistance of the thermistor must be capable of very flexible modification in order to enable the thermistors to work within different temperature ranges while retaining the same rational production method and trimming procedure.

The present invention accomplishes these purposes by the design of a thermistor which is characterized by the fact that it comprises at least two thermistor plates on a carrier adjacent to each other and connected in series, said plates are separated from each other by a preferably elongated gap, and the upper surfaces of said plates are largely covered with upper electrode surfaces, the thermistor plates being arranged within a limited area of the carrier so that the maximum aggregate area of the thermistor plates is constant, whereas the size of each individual thermistor surface is variable by displacement of the position of the gap(s) within the said limited area on the carrier, for adjustment of the total resistance of the thermistors to different values.

The process by which the thermistor is manufactured is according to the invention characterized by the fact that the thermistor is manufactured by a thick-film process, by screen printing on a limited area of a carrier a first layer of contact material to form one or more lower electrode surfaces, a second layer of thermistor material to form thermistor plates arranged on the lower electrode surfaces and separated from one another by a preferably elongated gap, and a third layer of contact material to form one or more upper electrode surfaces which largely cover the thermistor plates, said upper electrode surfaces are trimmed to a predetermined resistance value.

Further advantageous features of the invention will be apparent from the following description of embodiments of the invention, and from the dependent claims.

The design of the thermistor with two or more thermistor plates separated by a gap and connected in series within a limited area on the carrier implies the advantage that the total resistance of the thermistor can be altered from a very high maximum value to a low minimum value simply by altering the position of the gap(s) on the carrier. The part-resistance of each thermistor plate is inversely proportional to the area, and the total resistance of the thermistor is the sum of the part-resistances of the thermistor plates connected in series. The greater the difference in size between the thermistor plates, i.e. the further out towards the edges of the limited area the gap is placed, the higher the total ohmic value of the thermistor. The lowest ohmic value is obtained when the thermistor plates are equal in size. A further increase in the total resistance may be achieved by giving the thermistor more than two thermistor plates.

The size of the upper electrode surface is adjusted to the size of the thermistor plates, which means that irrespective of the position of the gap or gaps on the carrier the aggregate upper electrode surface is constant. This fact means that the total area available for trimming remains unaltered in spite of variations in the placing of the gap, which makes it possible to use the same effective trimming process for thermistors with different resistance performance.

The thermistor as defined in the claims can be used for measurement of temperature within different temperature ranges. These characteristics lend flexibility to the thermistor and enable its field of application to be extended by a simple change in the production process, for example by changing the screen in a screen printing process, while retaining the same effective production method and high accuracy.

Yet another advantage of the thermistor according to the present invention is the possibility of selecting the upper electrode surface(s) on which the thermistor is to be trimmed, depending on the demanded accuracy of the thermistor. For example, in a thermistor with two thermistor plates with upper electrode surfaces of which One is larger than the other, the effect of trimming the one surface will differ from the effect of trimming the other, i.e. the percentage change in the resistance varies depending on which surface is trimmed. If the larger surface is trimmed, the precision will be greater. When high precision is demanded, the smaller surface preferably can be rough-trimmed and the larger surface can be fine-trimmed. When the smaller surface is trimmed, the speed of trimming is instead increased, which means that a rough trimming of the larger surface and fine trimming of the smaller one gives quicker but less accurate trimming. Other combinations of trimming are also possible within the scope of the invention, such as only one trimming in one of the surfaces or several trimmings in just one surface.

The connection of the thermistor to an electric circuit is accomplished by connecting electric conductors direct to the electrode surfaces or to special contact surfaces connected to the electrode surfaces. The conductors may be connected in various ways to the electrode surfaces/contact surfaces, such as by gluing, soldering, bonding or by spring contact. The special contact surfaces are extended so that they are not in direct contact with the thermistor plates, which has the advantage that it reduces the risk of heating of the material of the thermistor and thus changing the properties of the material when connecting the conductors by, for example, soldering.

BRIEF DESCRIPTION OF THE DRAWINGS

An embodiment of the present invention and modifications thereof are described in greater detail below with reference to appended drawings, where.

DETAILED DESCRIPTION OF PREFERRED EMBODIMENTS OF THE INVENTION

Figure 1:
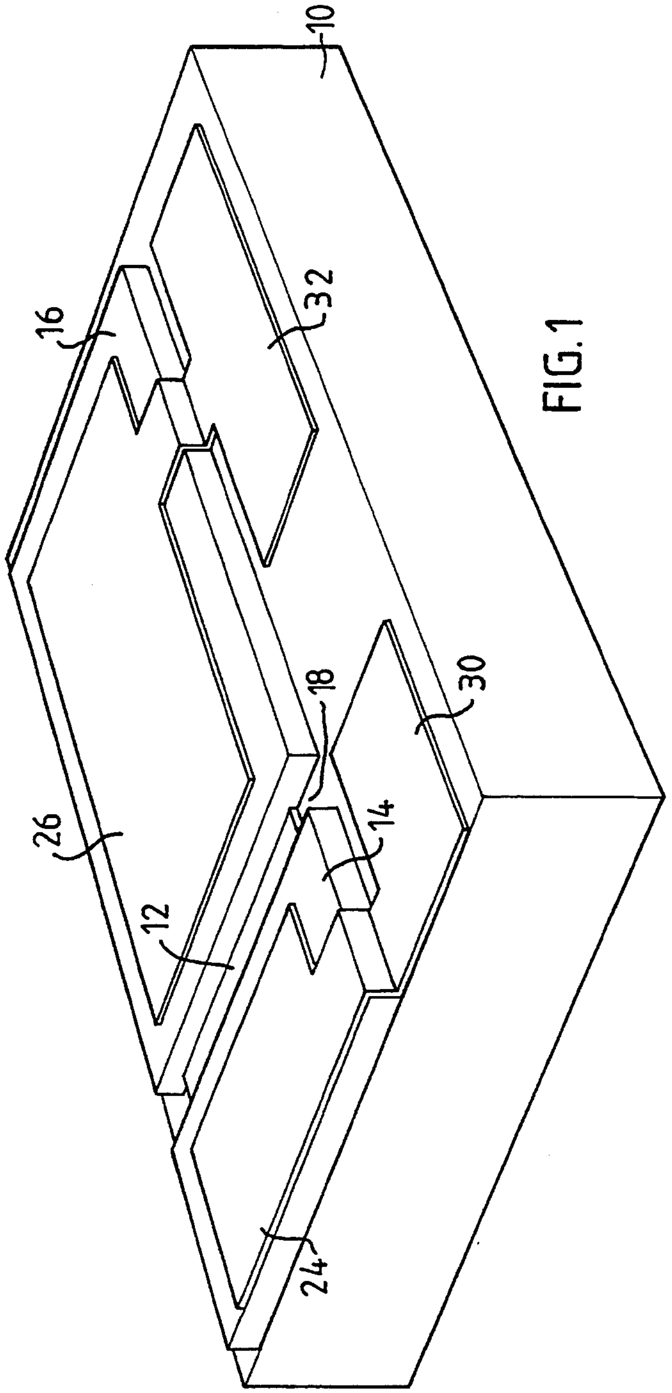
FIG. 1 shows a perspective view of a first embodiment of a thermistor before trimming, FIGS. 2 a–e show the different layers of the thermistor in the embodiment according to FIG. 1.
Figure 2A:
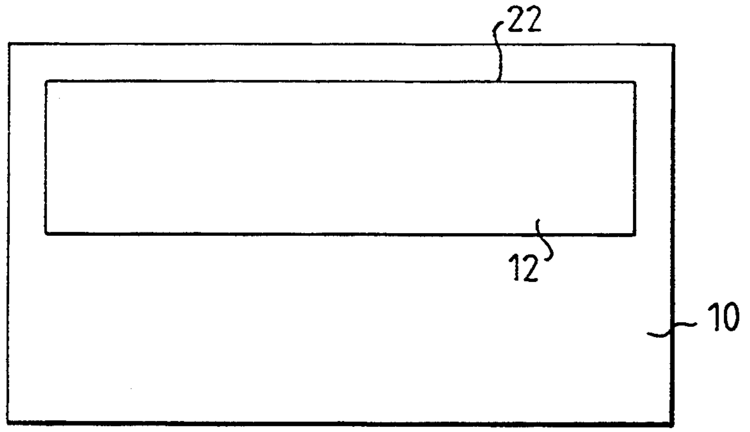
Figure 3:
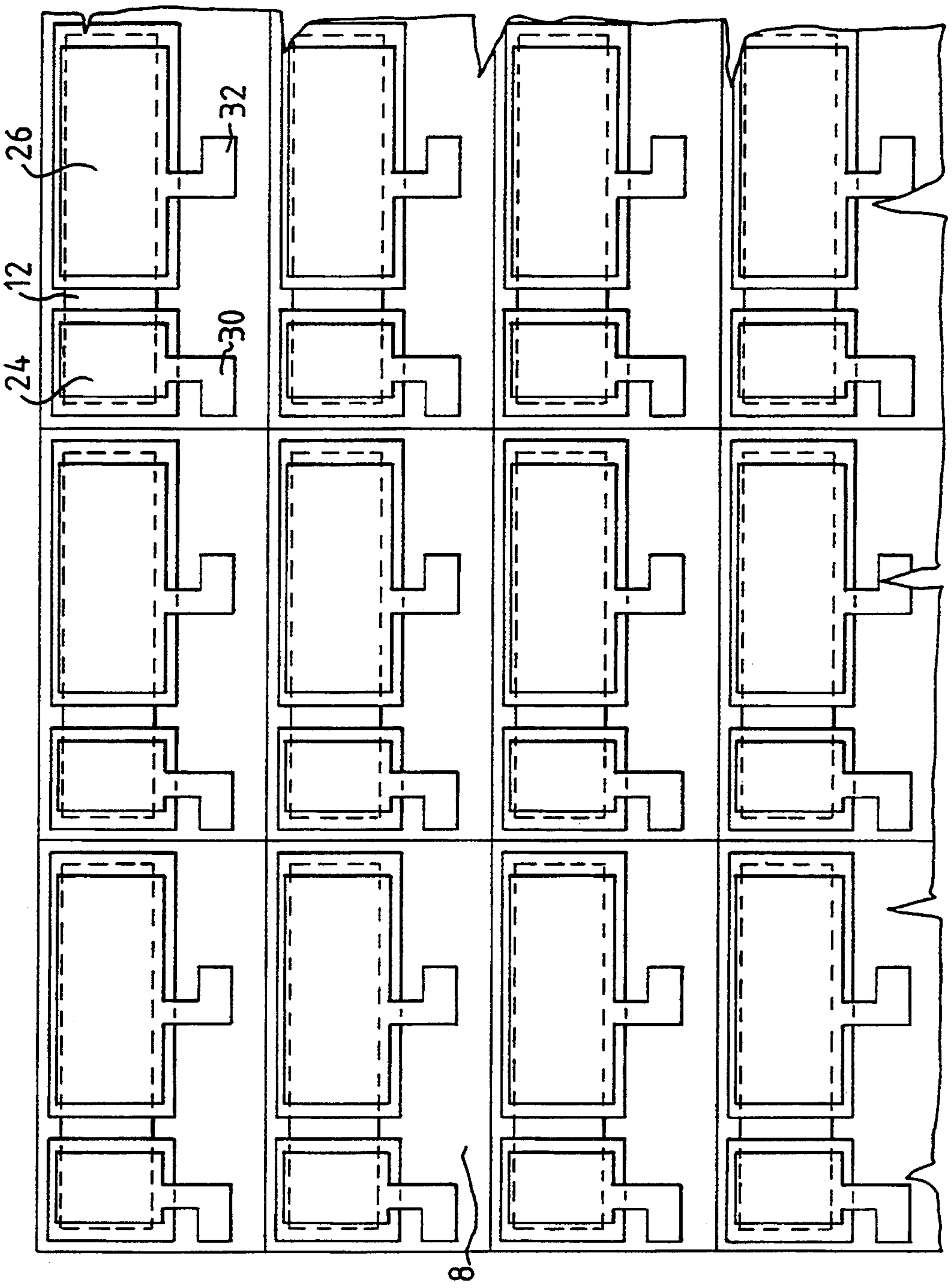
FIG. 3 shows a number of thermistors according to FIG. 1 on a substrate plate.

FIG. 1 shows a thermistor according to the invention, which is preferably manufactured by a thick-film process. On a non-conducting substrate plate (8), see FIG. 3, preferably of aluminium oxide, with notches for approx. 200 carriers (10), a first layer of a conductive contact material is applied by a screen printing process, forming a first electrode surface (12) or bottom conductor on each carrier (10), which is shown more clearly in FIG. 2*a*. The substrate plate is dried to remove the solvent in the print, after which firing takes place in a belt furnace.

Figure 2B:
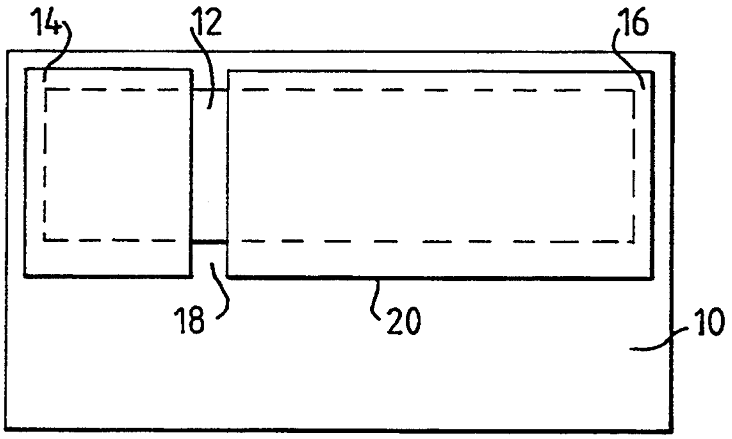

FIG. 2*b* shows the carrier (10) with a second screen printed layer of thermistor paste, which forms two separate thermistor plates (14, 16) between which is formed an open gap (18). The surface area of the thermistor plates (14, 16) is so defined that the outer edges of the plates (20) lie outside the outer edges (22) of the first electrode surface, except for the gap (18) between the plates. The substrate plate with the two layers of contact and thermistor material is now dried again.

Figure 2C:
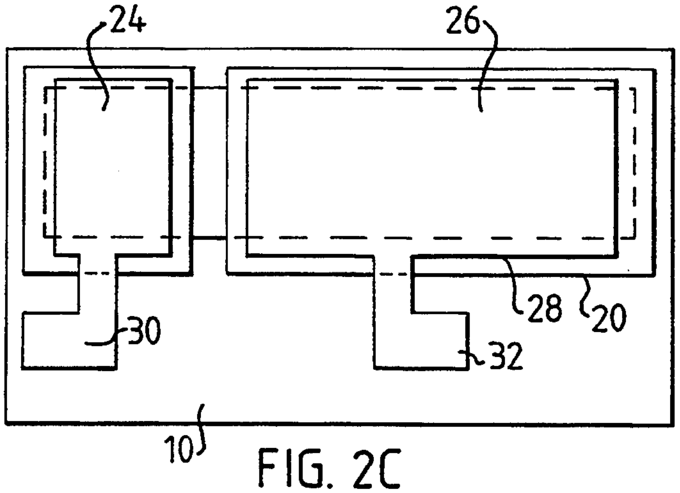

FIG. 2*c* (see also FIG. 1) shows how an additional layer of conductive contact material has been screen printed on the substrate plate so that a second electrode plate (24, 26) is formed on each of the thermistor plates (14, 16), these electrode surfaces forming the top conductor. These electrode surfaces (24, 26) are so designed that their outer contours (28) are inside the outer edges (20) of the thermistor plates with the exception of a part of each electrode, which is extended beyond the thermistor plate (14, 16) and there forms a contact surface (30, 32) which is in direct contact with the carrier (10).

In order to prevent short-circuiting between the electrode surfaces, i.e. between bottom and top conductors, it is essential for the top conductor (24, 26) to be smaller in area than the thermistor plates (14, 16) and for the thermistor plates (14, 16) to be larger than the bottom conductor (12).

The substrate plate is now dried again and then fired in a belt furnace.

Figure 2D:
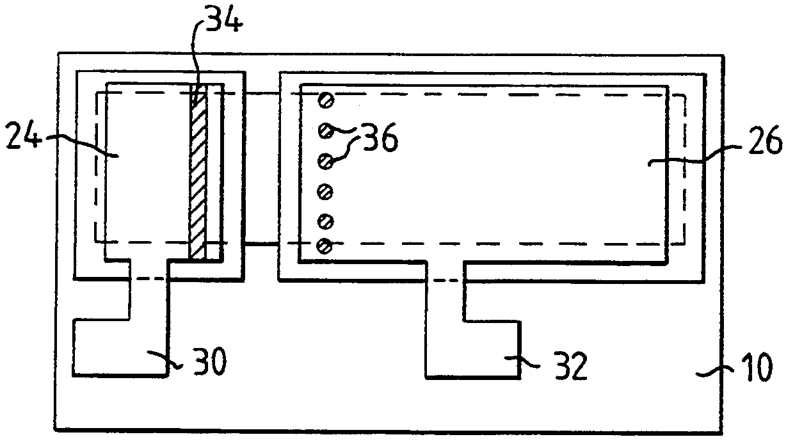

Adjustment of the resistances of the thermistors is accomplished by trimming the upper electrode surfaces (24, 26) of the thermistor, see FIG. 2*d*. The trimming is preferably carried out in two stages, a rough trimming and a fine trimming. In the embodiment of the thermistor shown in FIGS. 1 and 2, a rough trimming (34) has been carried out in one (24) of the two upper electrode surfaces, preferably in the smaller one, and a fine trimming (36) has been carried out in the other electrode surface (26), i.e. the larger.

FIG. 2*d* shows how parts of the two upper electrode surfaces have been removed by rough trimming (34) in the form of a number of cuts and fine trimming (36) in the form of a number of trimming holes.

Figure 2E:
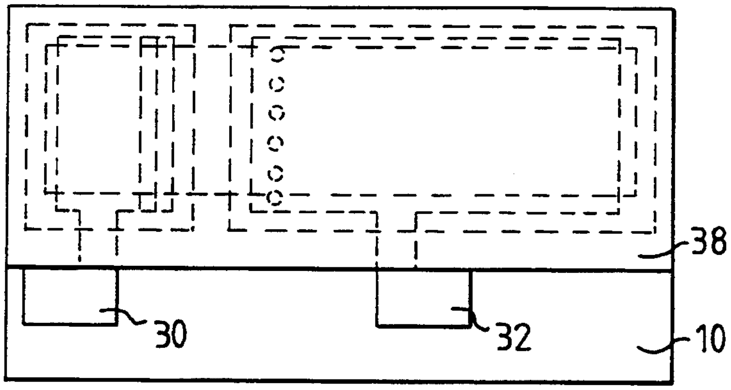

After completion of the trimming the thermistor, except for the contact surfaces (30, 32), is coated with a polymer layer (38) by a screen printing process, which helps to protect the thermistor and in particular counteracts its aging. The protective polymer layer is shown in FIG. 2*e*.

Figure 4A:
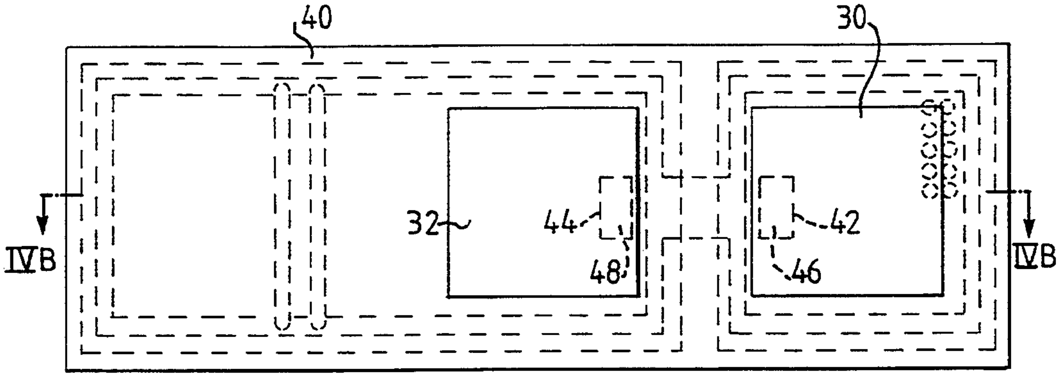
FIG. 4 shows a second embodiment of the thermistor and FIG. 4*b* shows a section of the thermistor according to FIG. 4*a*, FIGS. 5*a* and *b* show in the same way as in FIGS. 4*a* and *b* a third embodiment of the thermistor before it has been provided with trimming cuts and a protective polymer layer, FIGS. 6 *a* and *b* show in the same way as in FIGS. 4*a* and *b* a fourth embodiment of the thermistor, FIGS. 7*a* and *b* show in the same way as in FIGS. 4*a* and *b* a fifth embodiment of the thermistor without trimming cuts and polymer layer.
Figure 4B:
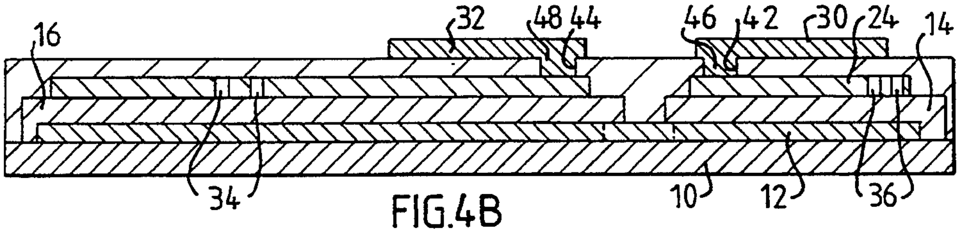

FIGS. 4*a* and 4*b* show a thermistor with an alternative embodiment of the placing of the contact surfaces (30, 32). On the upper electrode surfaces (24, 26) there is an insulating layer (40), in which there is an opening (42, 44) to each of the two electrode surfaces (24, 26). On the insulating layer, two contact surfaces (30, 32) are placed, each on a thermistor plate (14, 16) with connections (46, 48) through the openings (42, 44) to the electrode surfaces (24, 26). The trimming here is achieved by rough trimming (34) of the larger electrode surface and fine trimming holes (36) in the smaller electrode surface.

Figure 5A:
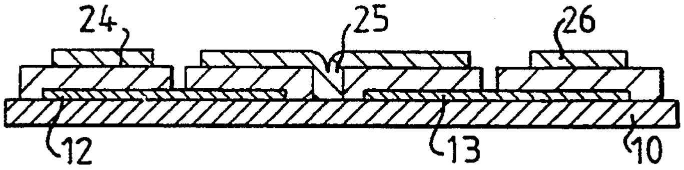
Figure 5B:
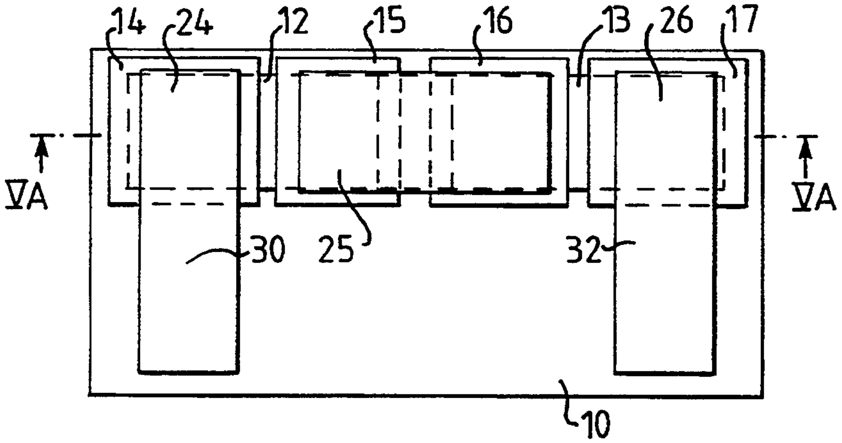

FIGS. 5*a* and *b* show an embodiment of the thermistor with more than two, in fact four, thermistor plates. The carrier (10) is provided with two lower electrode surfaces (12, 13) on which four thermistor plates (14, 15, 16, 17) are arranged in pairs. Three upper electrode surfaces (24, 25, 26) are arranged on the thermistor plates, the two outermost (24, 26) being connected to the two contact surfaces (30, 32). The middle upper electrode surface (25) connects the two middle thermistor plates together in series.

Figure 6A:
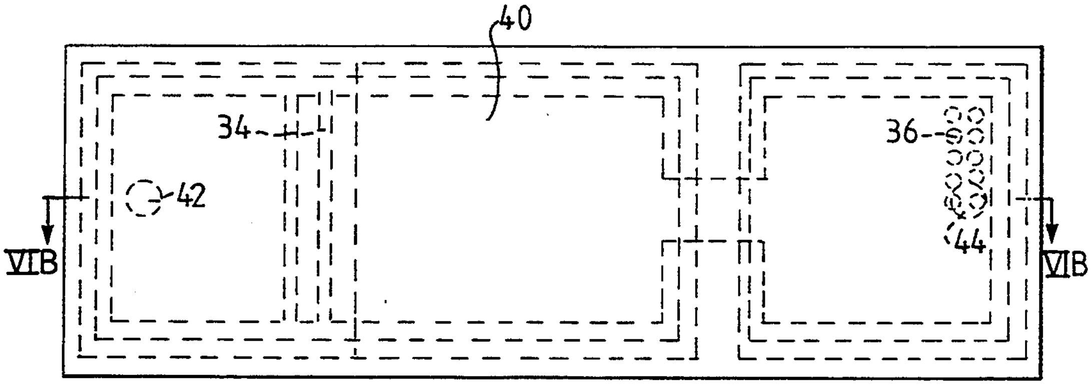
Figure 6B:
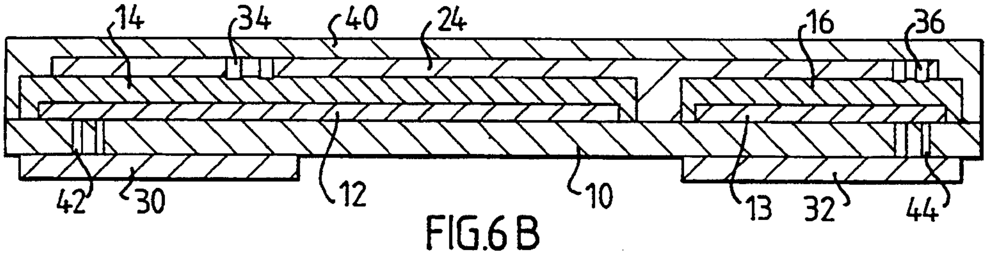

FIGS. 6*a* and *b* show a thermistor with two lower electrode surfaces (12, 13) which are fully covered by the two thermistor plates (14, 16). The thermistor includes only one upper electrode surface (24), in which rough and fine trimming are carried out. The whole upper side of the carrier is then covered with an insulating layer (40). The two contact surfaces (30, 32) are arranged on the underside of the carrier (10) and connected to the two lower electrode surfaces (12, 13) through connection openings (42, 44) in the carrier (10).

Figure 7A:
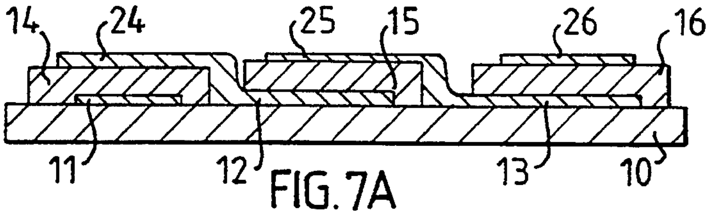
Figure 7B:
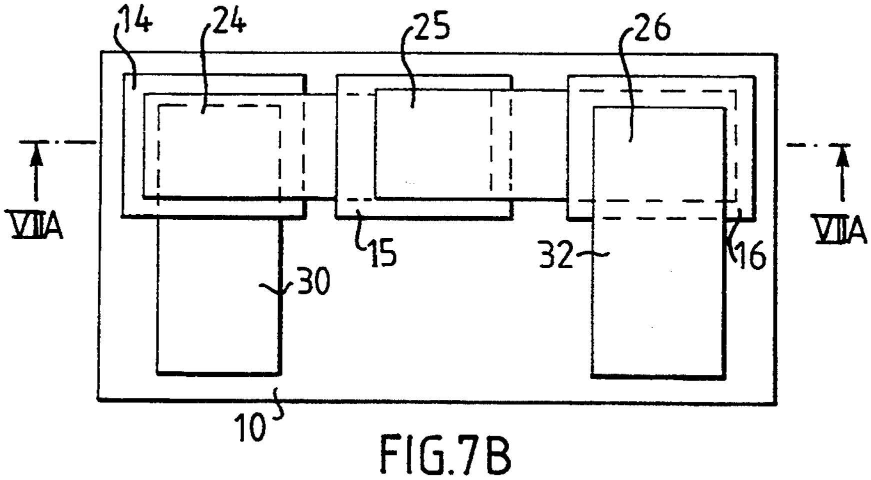

FIGS. 7*a* and *b* show another embodiment of the thermistor, which consists of three thermistor plates (14, 15, 16) arranged on three lower electrode surfaces (11, 12, 13). One (11) of the two outermost of these three lower electrode surfaces is extended beyond the thermistor plate (14) to form one of the two contact surfaces (30). The other two lower electrode surfaces (12, 13) are extended to make contact with the upper side of the respective adjacent thermistor plate (14, 15) and there form upper electrode surfaces (24, 25) while at the same time the two extended electrode surfaces thereby connect the three thermistor plates (14, 15, 16) in series. On the third and outermost thermistor plate (16) there is a third upper electrode surface (26), which is extended outside the thermistor plate (16) to form the other contact surface (32), which bears on the carrier (10).

The invention is by no means confined to the above-mentioned embodiments, and several modifications are conceivable within the scope of the claims. For example the trimming can be carried out in any one or several of the upper electrode surfaces, and the trimming surface(s) can be given different external forms. The number of thermistor plates may vary from two upwards. Similarly the total number of electrode surfaces, upper and lower, may be three or more, to enable the thermistor plates to be connected in series, one or more of them representing lower electrode surfaces and one or more representing upper ones.

The electrode surfaces and the thermistor plates may be embodied on the carrier in forms other than the square and the rectangular. They may, for example, be circular in shape so that the thermistor plates and the electrode surfaces are made up of concentric circles with one or more circular gaps in between.

What is claimed is:

1. A thermistor, preferably intended for temperature measurement, comprising:

a carrier;

at least two thermistor plates, of selected sizes, supported by the carrier and separated from each other, each thermistor plate having an upper surface and lower surface;

a first and second electrode surface, each respective electrode surface largely covering one of the surfaces of one thermistor plate; and a third electrode surface for electrically connecting the other surfaces of the two thermistor plates in series, wherein one of the thermistor plates is larger than the other and the corresponding upper electrode surface is also larger than the other.

2. A thermistor according to claim 1, wherein the thermistor plates are arranged within a limited area on the carrier, wherein the thermistor plates are separated from one another by an elongated gap, and wherein the overall resistance of the thermistor is selected by adjusting the relative size of each individual thermistor plate while maintaining the aggregate area of the thermistor plates constant.

3. A thermistor according to claim 1, wherein the electrode surfaces and thermistor plates are formed by a thick-film screen printing process.

4. A thermistor according to claim 1, wherein the carrier is a non-conductive substrate plate of aluminum oxide.

5. A thermistor according to claim 1, comprising at least one additional thermistor plate connected in series between the said other surfaces of the two thermistor plates.

6. A thermistor according to claim 1, wherein a rough trimming is carried out on one upper electrode surface and a fine trimming is carried out on the other upper electrode surface.

7. A thermistor according to claim 2, wherein the third electrode surface is arranged between the carrier and the lower surfaces of the thermistor plates, wherein the first and second electrode surfaces are disposed on the upper surfaces of the thermistor plates, and wherein the first and second electrode surfaces are trimmed to produce a predetermined resistance of the thermistor.

8. A thermistor according to claim 2, wherein the first and second electrode surfaces are connected to contact surfaces intended for connection to an electric circuit, and wherein the contact surfaces are not in direct contact with the thermistor plates.

9. A thermistor according to claim 6, wherein the rough trimming is carried out on the smaller upper electrode surface.

10. A thermistor according to claim 8, wherein the third electrode surface comprises a lower electrode surface arranged on the carrier, wherein the pair of thermistor plates are arranged on the lower electrode surface, and wherein the first and second electrode surfaces are each arranged on, and essentially covering, a respective thermistor plate.

11. A thermistor according to claim 8, wherein two lower electrode surfaces are arranged on the carrier, the two thermistor plates are arranged on and cover the lower electrode surfaces, an upper electrode surface is arranged on the thermistor plates, and the two contact surfaces are arranged on the underside of the carrier, said contact surfaces being connected through openings in the carrier to their respective lower electrode surface.

12. A thermistor according to claim 10, wherein the two upper electrode surfaces extend beyond the thermistor plates to form contact surfaces in direct contact with the carrier.

13. A thermistor according to claim 10, further comprising an insulating layer arranged on the upper electrode surfaces and having two openings communicating with the upper electrode surfaces, and two contact surfaces arranged on the insulating layer, wherein each contact surface is connected to a respective electrode surface through the respective opening.

14. A thermistor according to claim 10, wherein a rough trimming is carried out on one upper electrode surface and a fine trimming is carried out on the other upper electrode surface.

15. A thermistor according to claim 10, wherein the two thermistor plates are equal in size and the corresponding upper electrode surfaces are also equal in size.

16. A thermistor according to claim 12, wherein the outer edges of the lower electrode surface are arranged inside of, and near to, the outer edges of the thermistor plates, except for the gap between the plates, and also wherein the outer edges of the upper electrode surfaces are arranged mainly inside of, and near to, the outer edges of the thermistor plates.

17. A thermistor according to claim 14, wherein the rough trimming is carried out on the smaller upper electrode surface.

* * * * *